United States Patent

Moens et al.

(10) Patent No.: US 7,915,155 B2
(45) Date of Patent: Mar. 29, 2011

(54) DOUBLE TRENCH FOR ISOLATION OF SEMICONDUCTOR DEVICES

(75) Inventors: Peter Moens, Zottegem (BE); Marnix Tack, Merelbeke (BE); Sylvie Boonen, Laarne (BE); Paul Colson, Lotenhulle-Aalter (BE)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 12/651,683

(22) Filed: Jan. 4, 2010

(65) Prior Publication Data

US 2010/0105188 A1  Apr. 29, 2010

Related U.S. Application Data

(62) Division of application No. 11/399,377, filed on Apr. 7, 2006, now Pat. No. 7,667,270.

(30) Foreign Application Priority Data

Apr. 8, 2005  (GB) .................................. 0507157.6

(51) Int. Cl.
 *H01L 21/22* (2006.01)
(52) U.S. Cl. .................... 438/561; 257/341; 257/510
(58) Field of Classification Search .............. 438/561; 257/341, 510
 See application file for complete search history.

(56) References Cited

U.S. PATENT DOCUMENTS

| 4,717,682 | A | 1/1988 | Taka et al. |
| 5,397,731 | A | 3/1995 | Takemura |
| 5,549,762 | A | 8/1996 | Cantarini |
| 5,731,623 | A | 3/1998 | Ishimaru |
| 5,856,700 | A | 1/1999 | Woodbury |
| 6,333,235 | B1 | 12/2001 | Lee et al. |
| 6,972,471 | B2 | 12/2005 | Yang et al. |
| 2003/0168712 | A1 | 9/2003 | Shin et al. |
| 2003/0197242 | A1 | 10/2003 | Chen et al. |
| 2003/0219939 | A1 | 11/2003 | Ahmed et al. |
| 2005/0179111 | A1 | 8/2005 | Chao |

FOREIGN PATENT DOCUMENTS

| EP | 0 112 489 | 7/1984 |
| EP | 1 353 368 | 10/2003 |
| JP | 53-132279 | 11/1978 |
| JP | 62-213258 | 9/1987 |

OTHER PUBLICATIONS

Search Report of British Patent Office related to British Patent Application No. GB 0507157.6, Jul. 27, 2005.

*Primary Examiner* — Zandra Smith
*Assistant Examiner* — Paul E Patton
(74) *Attorney, Agent, or Firm* — Bacon & Thomas, PLLC

(57) ABSTRACT

Semiconductor device has a substrate (50), a buried layer (55), an active area extending from a surface contact to the buried layer, an insulator (130) in a first trench extending towards the buried layer, to isolate the active area, and a second insulator (130) in a second deep trench and extending through the buried layer to isolate the buried layer and the active area from other parts of the substrate. This double trench can help reduce the area needed for the electrical isolation between the active device and the other devices. Such reduction in area can enable greater integration or more cells in a multi cell super-MOS device, and so improve performance parameters such as Ron. The double trench can be manufactured using a first mask to etch both trenches at the same time, and subsequently using a second mask to etch the second deep trench deeper.

9 Claims, 8 Drawing Sheets

DOUBLE TRENCH FOR ISOLATION OF SEMICONDUCTOR DEVICES

CROSS-REFERENCE TO RELATED APPLICATIONS

This application is a divisional of U.S. patent application Ser. No. 11/399,377 filed Apr. 7, 2006, the entirety of which is incorporated herein by reference.

FIELD OF THE INVENTION

This invention relates to semiconductor devices and methods of manufacturing such devices.

DESCRIPTION OF THE RELATED ART

The concept of super-MOS devices is used to drastically reduce the specific on-resistance Ron for a given reverse breakdown voltage Vbd. Both vertical as well as lateral implementations are known. An important problem is the termination and isolation of such structures, when integrating such devices in a smart power platform with other devices. A super-MOS device contains an array or a matrix of unit cells. Hence, a unit cell in the center of the device sees a symmetric configuration: to the left and to the right of the unit cell the geometrical symmetry is conserved. At the periphery of the device, however, the symmetry is broken. As the operation of the transistor is based on the full depletion of the n-epi in between two cells, special precautions have to be taken to guarantee the reverse voltage capability at the periphery because of symmetry breaking. Typically one uses floating rings and racetrack structures to cope with the junction termination issues.

U.S. Pat. No. 5,856,700 shows using trenches to isolate single cells of a bipolar transistor from each other. It also uses self-aligned sinkers to contact the BLN, and is used for SOI (Silicon on insulator) devices.

M. Kodama et al., ISPSD2004, pp 463-466, FIG. 6 shows using a final trench to isolate a super-MOS device. A single final trench terminates the array of cells of the super-MOS transistor. The drain in the form of a buried layer extends below the trench and so the drain is not laterally isolated by the single final trench.

European patent application EP 02290902.2 shows making poly filled trenches with self aligned n-sinkers. EP 0112489 shows lateral isolation by a single trench etched in combination with a self-aligned n-sinker.

There remains a need for improved devices or methods.

SUMMARY OF THE INVENTION

An object of the invention is to provide improved semiconductor devices and methods of manufacturing such devices. Embodiments of the present invention are notable for addressing the problem of junction termination of devices such as integrated super-MOS transistors. Termination structures can be provided using trench isolation, to facilitate integration with other devices using known smart power technologies.

According to a first aspect, the invention provides:

A semiconductor device having a substrate, a buried layer on the substrate, an active area extending from a surface contact to the buried layer, an insulator in a first trench extending towards the buried layer, to isolate the active area, and a second insulator in a second deep trench and extending through the buried layer to isolate the buried layer and the active area from other parts of the substrate.

This can help reduce the area needed for the electrical isolation between the active device and the other devices. Owing to the insulator in the first trench, there is no more depletion in the region next to the deep trench (because there is no junction termination). Thus, the isolation distance between the deep trench isolation and the first cell can be reduced down to e.g. 3 μm. Without this double trench approach, the isolation distance is determined by the required blocking capability, and is typically around 15 μm for 100V, and larger for higher voltages. Such reduction in area is commercially valuable and can enable greater integration or more cells in a multi cell power device, and so improve important performance parameters such as Ron.

The semiconductor device according to the present invention can be a transistor. Alternatively, the semiconductor device can be a high voltage (HV) bipolar structure or a HV diode.

An additional feature of some embodiments is a conductive region extending from a second surface contact to the buried layer between the first trench and the second deep trench.

Another such additional feature is the conductive region comprising a diffusion region diffused from the second trench.

Another such additional feature is the active region forming part of a power transistor.

Another such additional feature is the power transistor comprising a super-MOS device.

Another such additional feature is the power transistor having multiple cells.

Another such additional feature is the first trench having a conductive element within the first insulator. This can enable the trench to be used as a part of the device or to be biased to improve performance.

Another such additional feature is the second trench having a conductive element within the second insulator. Again this can enable the trench to be used as a part of the device or to be biased to improve performance.

Another aspect provides a method of manufacturing a semiconductor device having the steps of forming a buried layer on a substrate, forming an active area extending from a surface contact to the buried layer, forming an insulator in a first trench extending towards the buried layer, to isolate the active area, and forming a second insulator in a second deep trench and extending through the buried layer to isolate the buried layer and the active area from other parts of the substrate.

An additional feature of some embodiments is the step of using a first mask to etch both trenches at the same time, and the step of subsequently using a second mask to etch the second deep trench deeper. This corresponds to the first embodiment below.

An additional feature of some embodiments is the step of using a first mask to etch both trenches at the same time, and the step of subsequently etching the second trench deeper using an oxide to prevent the first trench from being etched deeper. This corresponds to the second embodiment described below.

Another such additional feature is the step of lining the trenches with a thin layer of semiconductor material such as polysilicon and filling at least the first trench with a thick insulating material such as an oxide before the second trench is made deeper.

Another such additional feature is the step of removing the thick insulating layer, i.e. the thick oxide from the deeper trench, using the polysilicon as an etch stop. This corresponds to the first embodiment, while the second embodiment shows an alternative in which the polysilicon is removed from the deeper trench at this stage.

Another such additional feature is the step of forming a conductive region between the trenches and extending to the buried layer, before the second trench is made deeper.

Another such additional feature is the step, subsequent to the deepening of the second deep trench, of forming a protective spacer on the sidewalls of the second deep trench before removing the thick insulating layer, e.g. the oxide from the first trench.

Another such additional feature is the step of forming an insulator in both trenches after the thick oxide has been removed.

Another such feature is the step of subsequently providing a conductive layer inside the insulator in the trenches.

The above double trench approach can provide junction termination of a super-MOS, for example as well as isolation of the complete super-MOS device from other devices on the same chip. The isolation distance can be substantially reduced compared to single trench isolation approaches. This can be achieved by a process using only two extra masks. Techniques that can contribute to smaller feature sizes can be valuable to semiconductor manufacturers in general and to those who integrate power devices in particular. In some such cases, reduction of the feature sizes can allow the integration of greater numbers of transistor cells per unit area. This can lead to lower ON resistance for a power transistor that has many unit cells acting in parallel.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

How the present invention may be put into effect will now be described by way of example with reference to the appended drawings, in which.

DETAILED DESCRIPTION OF THE INVENTION

Figure 1:
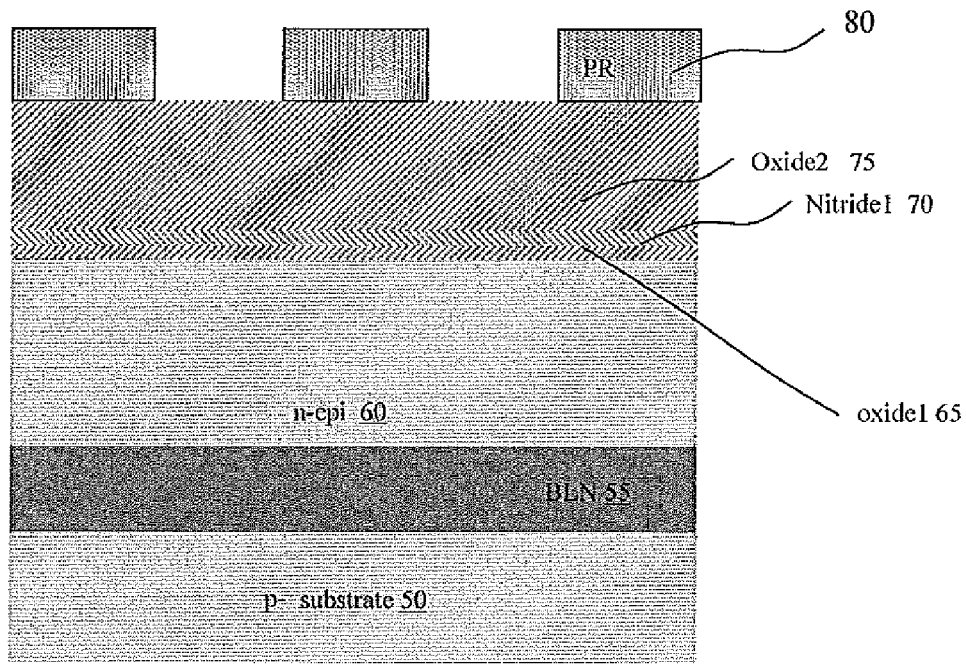
FIGS. 1 to 9 show steps of a process according to a first embodiment.

The present invention will be described with respect to particular embodiments and with reference to certain drawings but the invention is not limited thereto but only by the claims. Any reference signs in the claims shall not be construed as limiting the scope of the invention. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

Moreover, it is to be understood that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B. Where an indefinite or definite article is used when referring to a singular noun e.g. "a" or "an", "the", this includes a plural of that noun unless something else is specifically stated.

Figure 15:
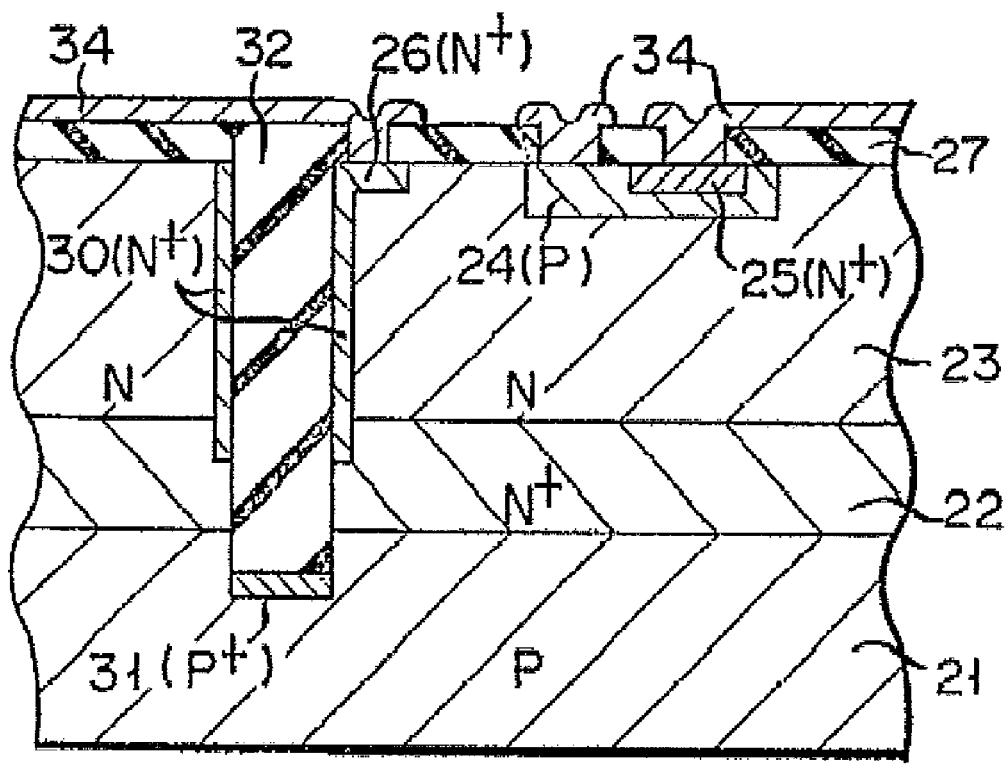
FIG. 15 shows a structure having an isolation trench known from EP 0112489.

By way of introduction to the embodiments, FIG. 15 shows a known way of manufacturing a reduced size isolation trench for a bipolar device as shown in above-mentioned EP 0112489. First antimony (Sb) is doped in a p-type silicon substrate 21 to form an n+-type buried layer 22. An n-type epitaxial layer 23 is formed by epitaxial growth on the n-type buried layer 22. A p-type base region 24, an n-type emitter region 25 and an n-type collector contact region 26 of a bipolar transistor are formed in the epitaxial layer 23 in a known manner. An oxide filth 27 is formed on the surface of the epitaxial layer 23 and is selectively etched to form an opening. This opening is used to form an isolation region to be filled with filler material 32 as described later. By using the oxide film 27 as a mask, RIE (reactive ion etching) is performed to form a trench (depth of about 30 μm) which extends through the epitaxial layer 23 and reaches the buried layer 22, and which exposes the n+-type collector contact region 26. By this etching method, the width of the trench is substantially the same as that of the opening. The trench has vertical side walls.

Thereafter, impurity diffusion is performed using $POCl_3$ (phosphorus oxychloride) as an impurity diffusion source so that an n+-type diffusion layer 30 is formed in the side walls and the bottom surface of the trench. As a result, the n-type buried layer 22 is electrically connected to the n-type collector contact region 26 through the n-type diffusion layer 30. The bottom surface of the trench is further etched by reactive ion etching so as to extend through the buried layer 22 so that the silicon substrate 21 is exposed. Thereafter, boron is ion implanted at the bottom of the deep trench to form a p-type layer 31 serving as a channel stopper. Subsequently, an insulating material 32 such as $SiO_2$ or $Si_3N_4$ is deposited by plasma CVD or low pressure CVD in the trench. In this case, a layer of the insulating material 32 is also deposited on the surface of the oxide film 27, so that a recess (valley) is formed in the surface of the insulating material layer which is located above the trench. In order to smooth the recess, an organic material layer such as a photoresist material layer is formed. The layer of insulating material 32 and the organic material layer are etched by sputtering until the surface of the oxide film 27 is exposed. PEP (photo-engraving process) is performed to selectively form electrode contact holes in the oxide film 27, and an electrode metal film is deposited. The electrode metal film is selectively etched by PEP, thereby forming an electrode pattern 34. Finally, sintering is performed and PSG (phosphosilicate glass) is applied, thereby preparing desired bipolar integrated circuits having an npn transistor. This transistor has a size-reduced n-type diffusion layer 30 in the side walls of the trench constituting the isolation region.

The embodiments described below are notable for addressing the problem of junction termination of devices such as e.g. integrated super-MOS transistors, HV bipolar devices and HV diodes. Below is described how to make the termination structures using trench isolation, to facilitate integration with other devices using known smart power technologies. In the embodiments, loss of blocking voltage capability due to symmetry breaking at the edges of arrays of cells, is handled by a trench-insulating layer such as a trench oxide. The embodiments provide an innovative double sequential trench etching approach requiring only two extra masks to make both the trenches for the super-MOS device as well as the deep trenches for the vertical isolation.

Compared to the above-mentioned paper by M. Kodama showing a single final trench terminating the array of the super-MOS transistor, the embodiments described use a double trench approach to ensure at least one of:

1. Termination of the super-MOS transistor array, and
2. Isolation of the total super-MOS (active area+drain) from the remaining part of the chip, to avoid interference with other devices on the same chip.

In this way the embodiments are also different from above-mentioned U.S. Pat. No. 5,856,700 which shows using trenches to isolate every single cell of a bipolar device. Also the known techniques use a single trench approach on SOI, whereas the embodiments described are not so limited, and can be applied to standard junction isolation technologies.

Figure 8:
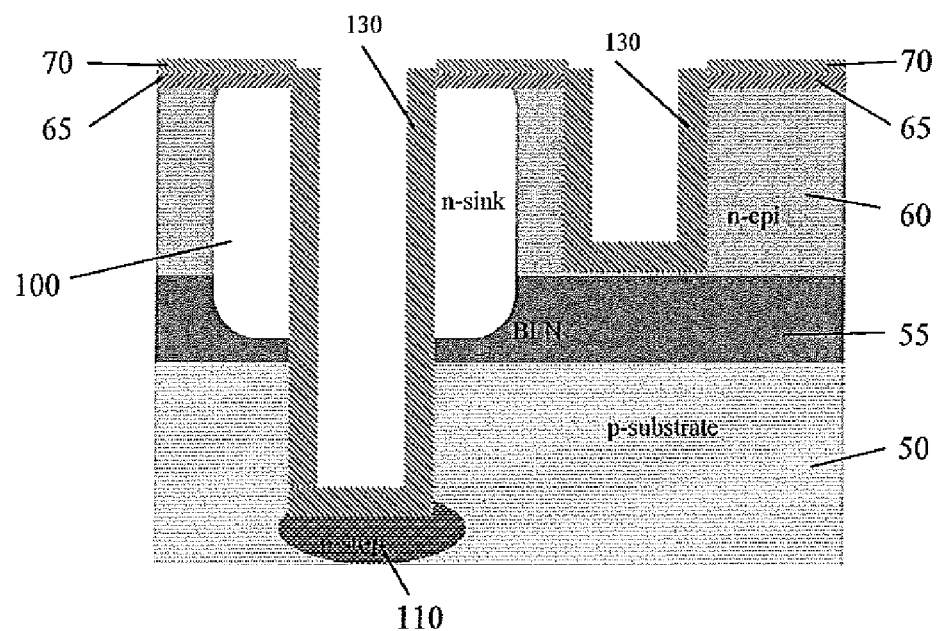
Figure 9:
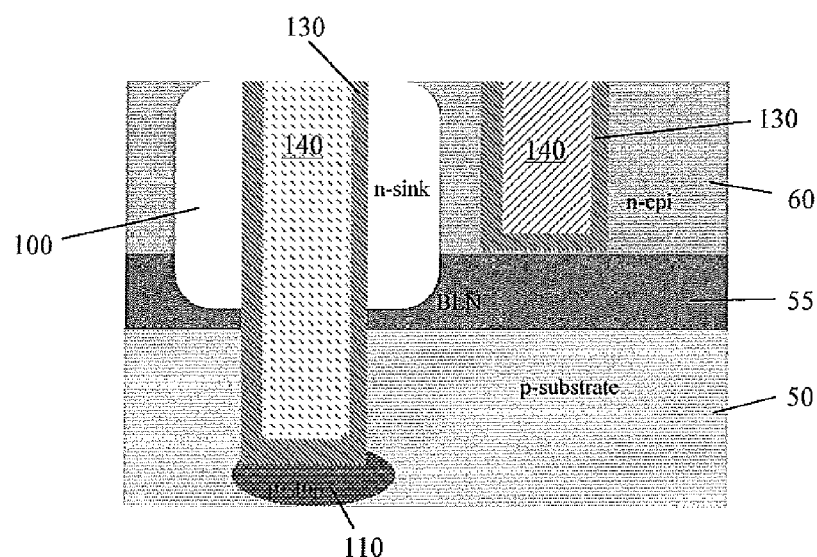
Figure 10:
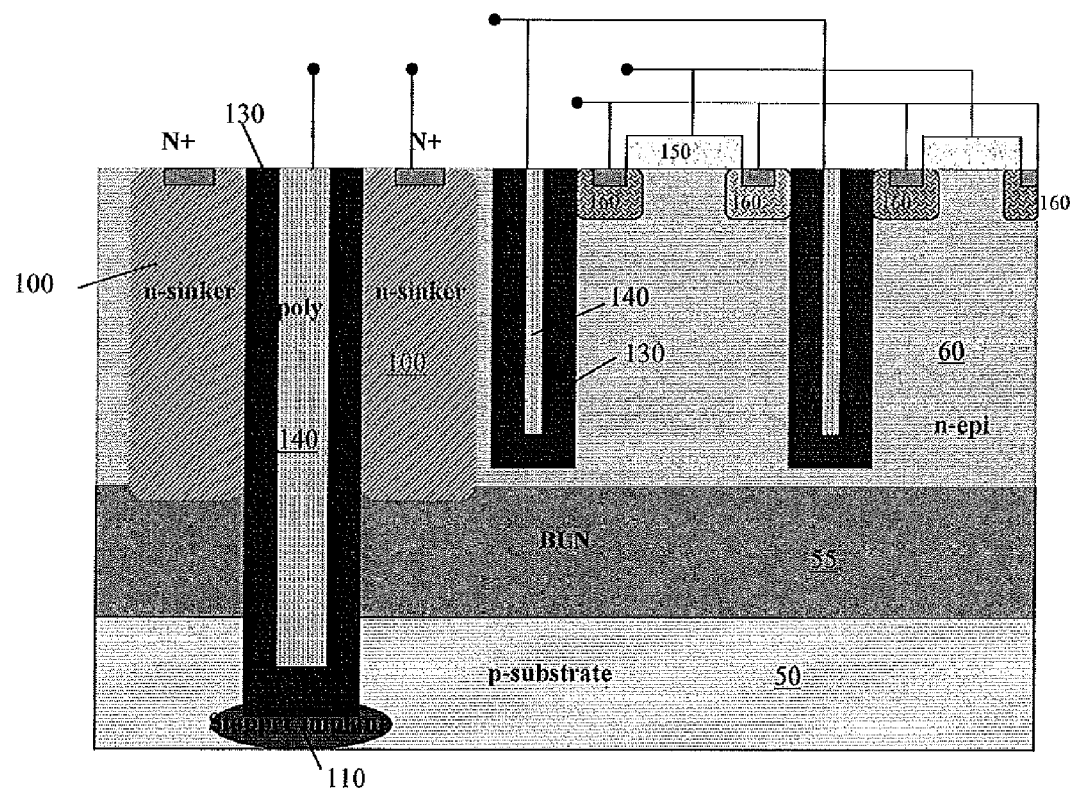
FIG. 10 shows a device according to an embodiment.

FIG. 10 shows a device and FIGS. 1 to 9 show the associated process flow according to a first embodiment of the present invention.

First Embodiment (a) As shown in FIG. 1, on top of a lowly doped substrate of a first conductivity type, e.g. a p-substrate ($\sim 10^{15}$-$10^{16}$ atoms/cm$^3$) 50 for example of silicon, and a highly doped buried layer of a second conductivity type, e.g. a highly doped buried n-type buried layer ($\sim 10^{18}$-$10^{19}$ atoms/cm$^3$) 55, a moderately doped epitaxial layer of the second conductivity type, e.g. a moderately doped n-epi ($\sim 10^{15}$-$10^{16}$ atoms/cm$^3$) layer 60 is grown. The concentration and thickness of the n-epi layer 60 is preferably tuned for optimal performance of the device, and is as such dependent on the targeted breakdown voltage Vbd. The thickness will be in the order of 3-10 µm for the voltage range of interest (50-200V). A thin insulating layer such as an oxide layer 65 (oxide1), having a thickness of about 15-40 nm, is grown on top of the n-epi layer 60. A thin insulating layer such as a thin nitride layer 70 (nitride1) having a thickness, for example of 20-50 nm, is subsequently deposited. Then, a thick insulating layer such as a thick oxide layer 75 (oxide2), having a thickness for example of about 1-5 µm, is deposited e.g. using a chemical vapour deposition technique such as PECVD or LPCVD TEOS. Accordingly, a stack ONO (Oxide, Nitride, Oxide) is obtained. Regions where the first trench etching will appear are then defined by any suitable technique. For example, a photoresist (PR) mask (MASK1) 80 is deposited, defining the regions where the first trench etching will appear.

Figure 2:
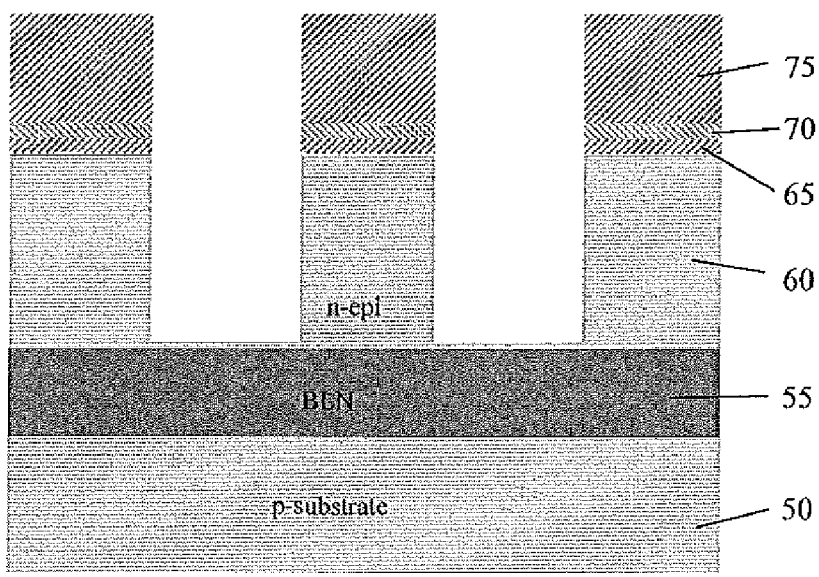
Figure 3:
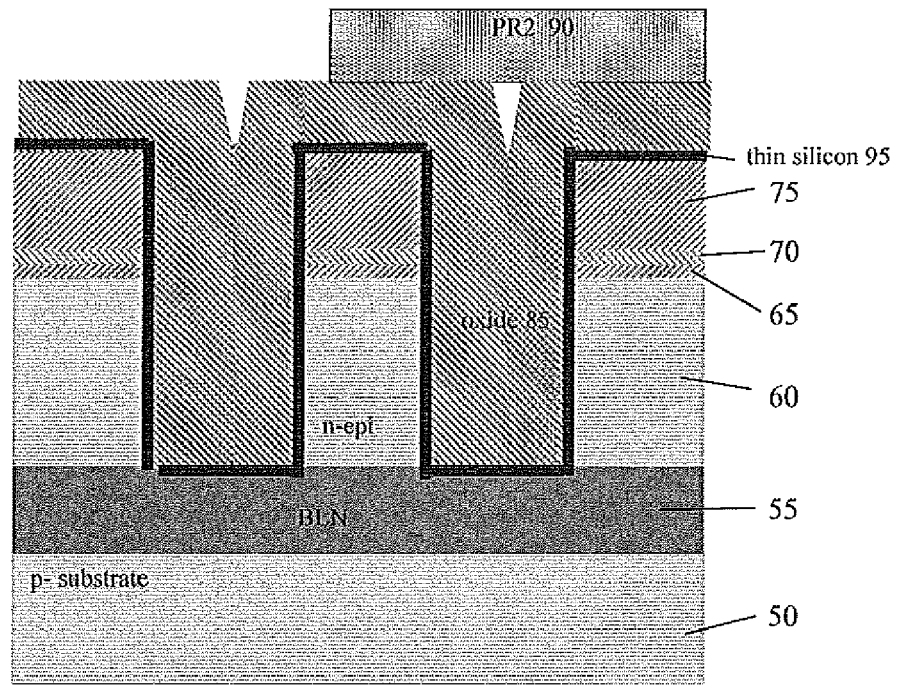

(b) The first trench etching consists of an etch of the insulating layers 75, 70 and 65, e.g. an oxide etch, nitride etch, oxide etch, and of the epitaxial layer, e.g. a silicon etch. The silicon of the epi layer 60 is etched down to the buried layer 55, hence it depends on the epi layer thickness (typically 3-10 µm). Subsequently, the first photoresist mask 80 is removed as shown in FIG. 2.

(c) A thin layer of semiconductor material is deposited epitaxially by a suitable technique such as a chemical vapour deposition technique, e.g. an LPCVD silicon (polysilicon or amorphous silicon) 95 with a typical thickness of 100±50 nm. A thick insulating layer such as a thick oxide layer 85 having a thickness between about 1-5 µm is deposited e.g. using a chemical vapour deposition technique such as PECVD or LPCVD TEOS such that the trenches are completely filled with oxide. A polishing step such as a CMP step can here be introduced to reduce the oxide thickness. A second photoresist mask 90 (PR2) is placed, defining the regions in which the deep trench isolation structures have to be formed. Hence, referring to FIG. 3 the left hand side trench will become a deep isolation structure, whereas the right hand side trench will become a super-MOS transistor.

Figure 4:
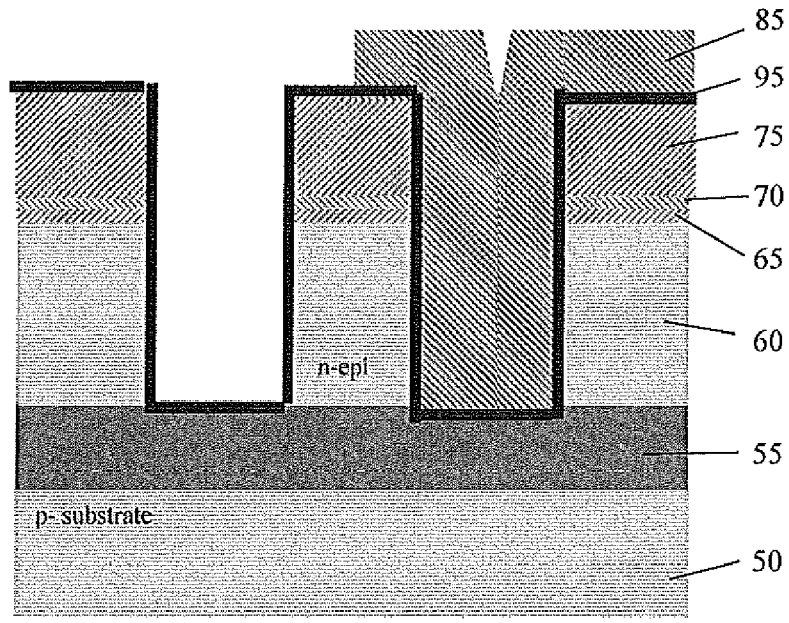

(d) A wet oxide etch will be performed in order to remove the thick oxide 85 in the trench. All oxide 85 has to be removed from the trench. Mask 90 (PR2) is removed. The silicon layer 95 acts as an etch-stop layer and prevents under etch of the oxide 65, 75 in the ONO hard mask stack, as shown in FIG. 4.

Figure 5:
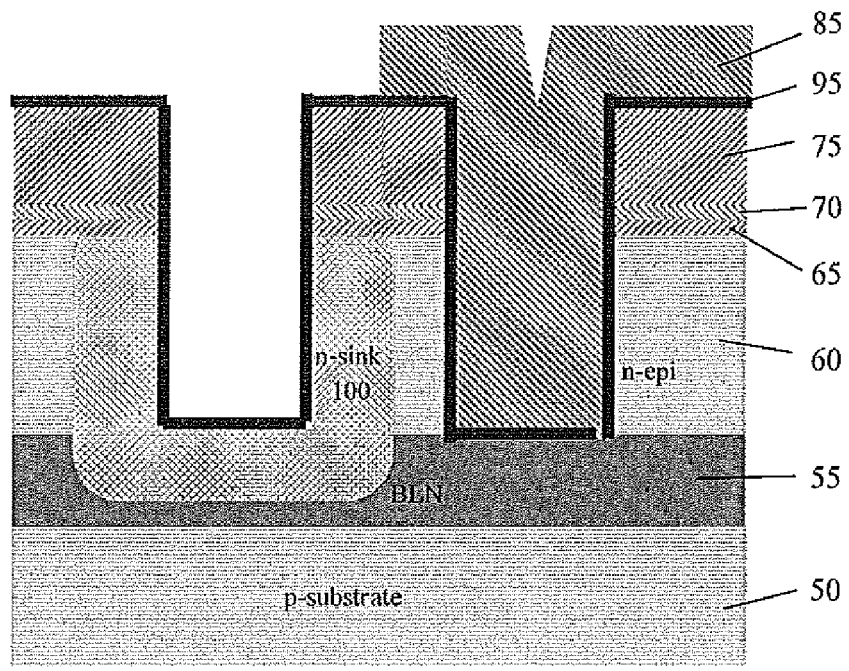

(e) A highly doped sinker of the second conductivity type, e.g. a highly doped (e.g. $\sim 10^{19}$-$10^{20}$ atoms/cm$^3$) n-sinker 100 is introduced by using e.g. diffusion. A thermal budget (e.g. $\sim 900$-$1100°$ C.) is applied in order to activate the dopants. The diffusion of the dopants must be such that the bottom of the n-sinker profile is still within the BLN profile 55, as shown in FIG. 5.

Figure 6:
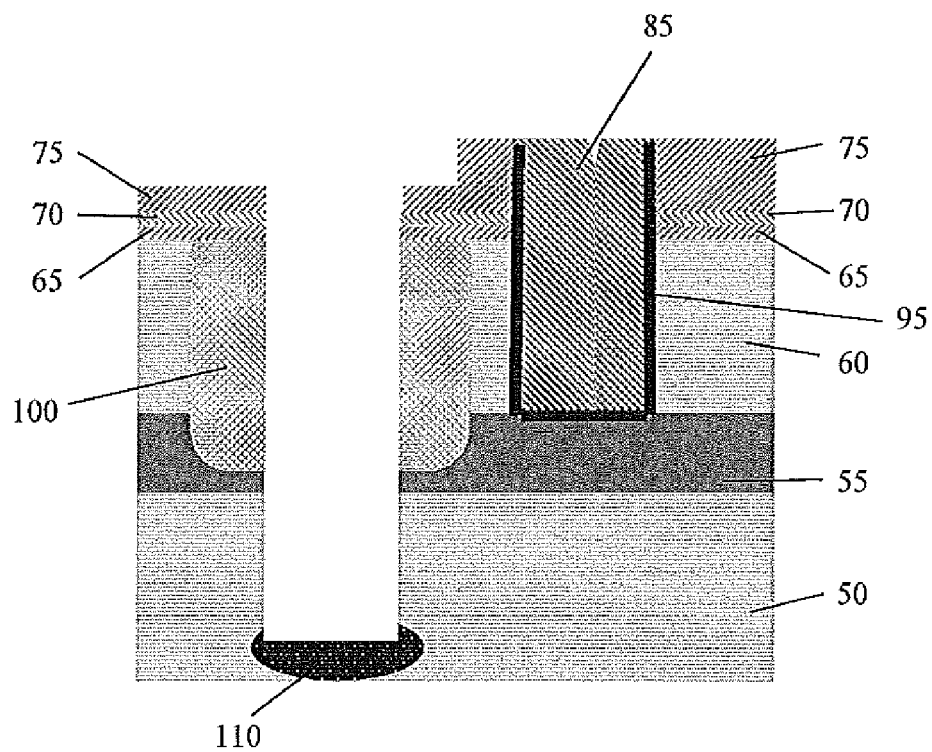

(f) A second Si trench etching is then performed to deepen the trench, as shown in FIG. 6. The regions with bare silicon (second deep trench shown on left hand side of FIG. 5) will be subjected to the etching agent, whereas the regions covered with oxide 85 are protected from the etching agent. During the Si etch, also the nitride1 layer 70 and oxide2 layer 75 will be partially etched. However, oxide2 layer 75 needs to be sufficiently thick in order to have some remaining oxide left after the Si trench etching to protect the nitride1 layer 70. The depth of the second trench etching is determined by the required blocking voltage capability as well as by the doping concentration of the substrate 50 (higher doping concentrations require less deep trenches). The depth of the second trench is typically between 5 and 30 µm. In order to kill the parasitic nMOS of the isolation structure, an implant of the first conductivity type, e.g. a p-stop implant 110 is applied. The doping concentration at the bottom of the trench is typically $10^{18}$-$10^{19}$ atoms/cm$^3$. The implant element is typically Boron, but can be any p-type dopant. In case the substrate 50 is sufficiently doped, the p-stop implant 110 can be omitted.

Figure 7:
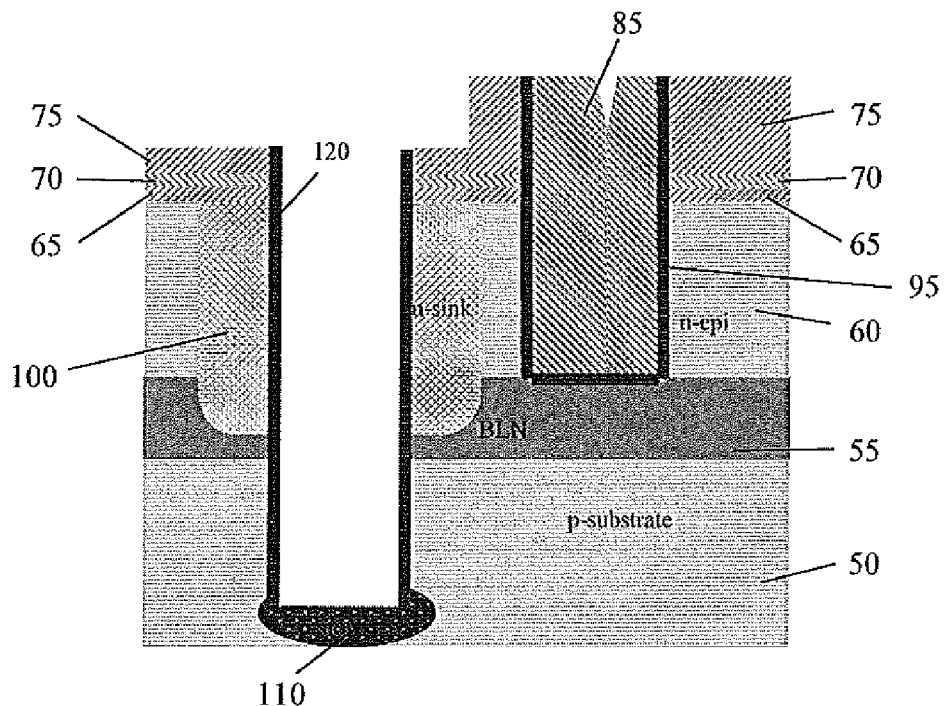

(g) As shown in FIG. 7, a thin layer of semiconductor material is deposited, e.g. an epitaxial layer deposited by chemical vapour deposition such as a LPCVD silicon layer 120 (poly or amorphous) with a typical thickness of 100±50 nm is deposited, followed by a blanked silicon etch. This step will form a silicon spacer on the sidewalls of the trench and the remaining hard mask. This spacer will prevent under etch of the oxide hard mask in the next process step.

(h) A wet oxide etch is applied in order to remove the thick oxide layers 75, 85. The etch stops on the thin nitride layer 70. The super-MOS trench (right hand side) must be clean of oxide 85. Subsequently, as shown in FIG. 8, an insulating liner such as a liner oxide 130 is thermally grown on the trench bottom and sidewalls using wet oxidation, of both the deep trench isolation as well as the super-MOS trenches. The liner oxide thickness is preferably such that the oxide can withstand the required blocking capability of the transistors/ technology. Typically, the oxide thickness is between 300 and 700 nm. The thermal budget associated with the liner oxide growth (typically at 1000° C.) also serves to reduce the stress in the Si lattice due to the trench etching and trench oxidation. The thin oxide and nitride on the top of the Si will create a birds beak at the top of the trench.

(i) The trenches are preferably filled with a doped or undoped semiconductor material such as doped Poly Si 140, although undoped Poly Si is also suitable. The polysilicon 140 is etched back by any suitable process, e.g. plasma processing or is partially removed by CMP. The thin nitride layer 70 and oxide layer 65 are removed, as shown in FIG. 9.

From here on, the implementation of the Super-MOS device is straightforward, a device cross-section is shown in FIG. 10. The gate oxide and poly 150 can be provided as in conventional CMOS devices. If a different gate oxide thickness is required, an additional mask and oxidation has to be applied. The p-body 160 is typically self-aligned to the gate, but this is not mandatory. The n-type lightly doped drain nldd and n+ can be equal to a conventional CMOS nldd and n+, but this is not mandatory. The p-body is contacted using p+/pldd (equal to CMOS).

The process for the first embodiment can be summarized as follows: form a layer for an active area, etch both trenches using a first mask, remove first mask, form thin semiconductor layer such as a poly Si layer, fill with insulating material such as a thick oxide, apply second mask open over the second deep trench, wet oxide etch to remove the thick oxide from the deep trench with poly Si as etch stop, remove second mask, diffuse conductive region around deep trench to reach the buried layer, etch deep trench deeper to isolate the buried layer, form protective semiconductor, e.g. silicon spacer on side walls, remove thick oxide from both trenches while masking the first trench, apply thin liner oxide insulator to trenches, fill trenches with semiconductor material such as poly Si, remove oxide and nitride layers from surface, form control electrode, e.g. gate and main power electrode regions, e.g. source/drain regions, and surface contacts.

Embodiment 2 (FIGS. 11 to 14) will now be described.

FIGS. 11 to 14 show another implementation of a process to form the same structure as that of FIG. 10, also requiring only two extra masks.

Figure 11:
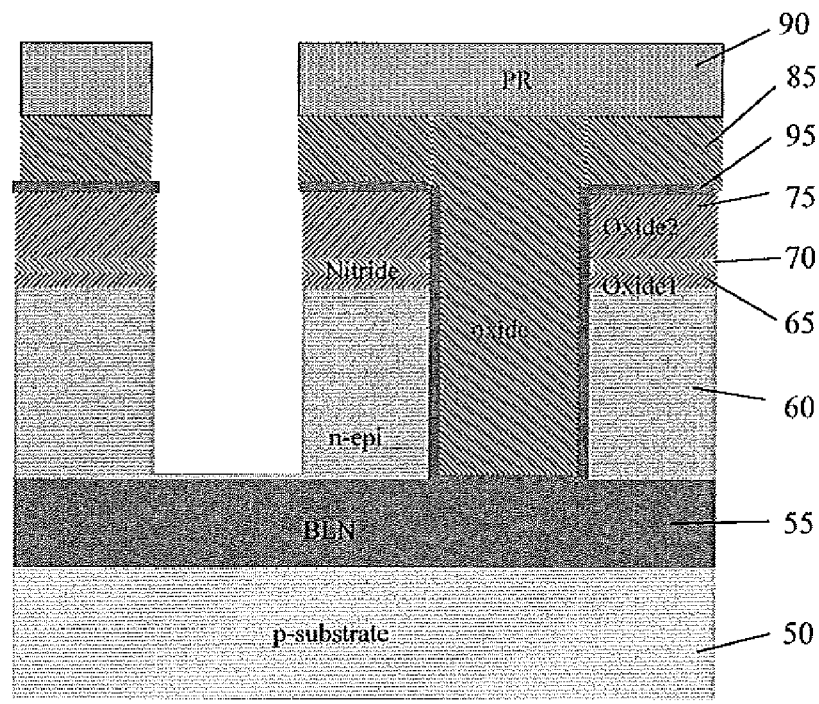
FIGS. 11 to 14 show steps of a process according to another embodiment.
Figure 12:
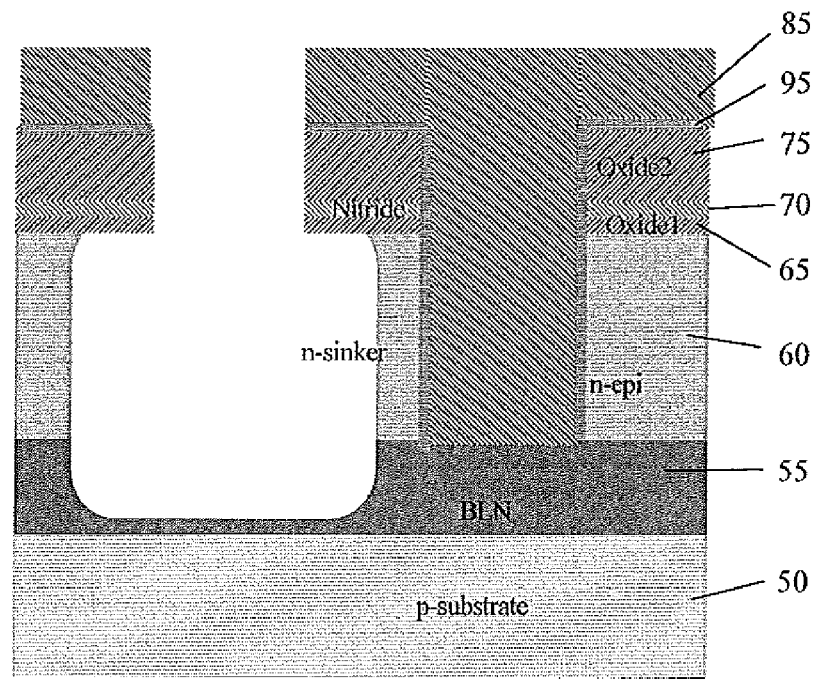
Figure 13:
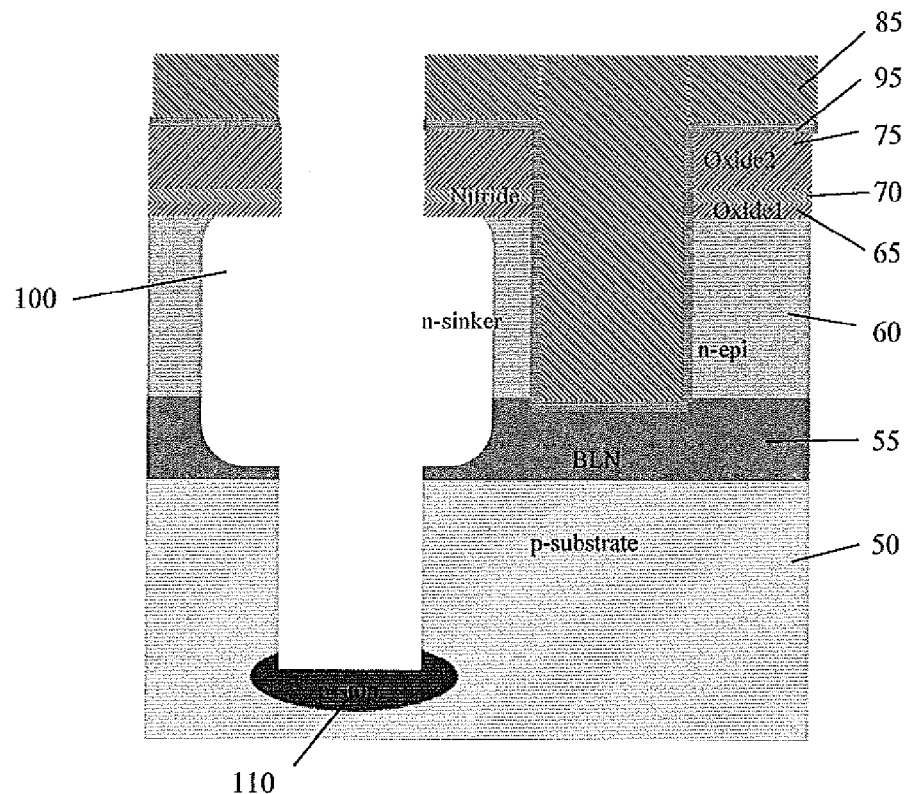
Figure 14:
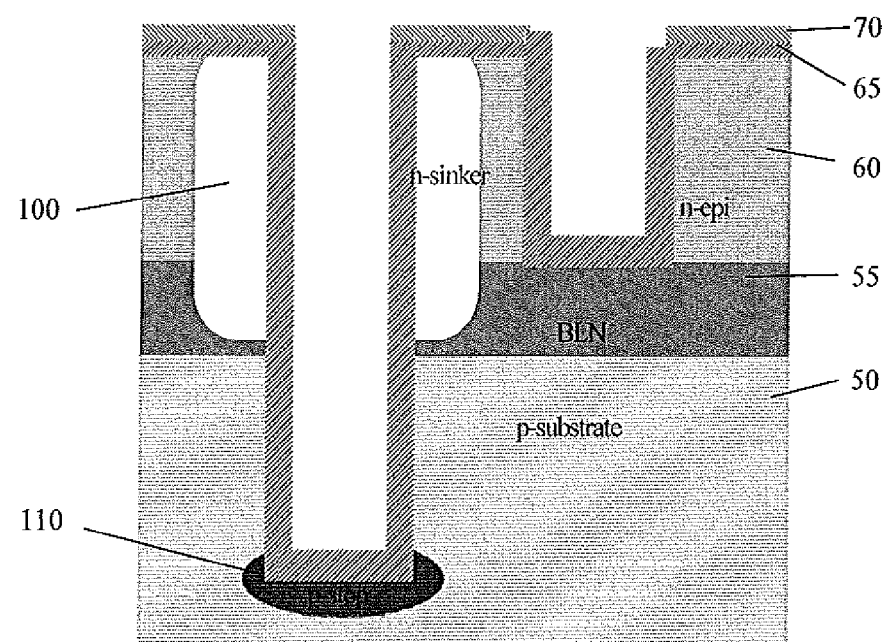

(a) On top of a lowly doped semiconductor substrate of a first conductivity type, e.g. a lowly doped p-substrate 50 ($\sim10^{15}$-$10^{16}$ atoms/cm$^3$) for example of silicon and a highly doped buried layer of a second conductivity type, e.g. a highly doped n-type buried layer 55 ($10^{18}$-$10^{19}$ atoms/cm$^3$), a moderately doped semiconductor layer of the second conductivity type, e.g. a moderately doped epitaxial layer 60, n-epi, ($\sim10^{15}$-$10^{16}$ atoms/cm$^3$) is grown. The concentration and thickness of the n-epi layer 60 has to be tuned for optimal performance of the device, and is as such dependent on the targeted breakdown voltage Vbd. The thickness will be in the order of 3-10 μm for the voltage range of interest (50-200 V). A thin insulating layer such as a thin oxide layer 65 (oxide1) ($\sim$15-40 nm) is grown on top of the n-epi layer 60. A further thin insulating layer e.g. a thin nitride layer 70 (nitride2) (20-50 nm) is subsequently deposited. Then, a thick insulating layer such as a thick oxide layer 75 (oxide2) ($\sim$1-5 μm) is deposited e.g. using a chemical vapor deposition technique such as PECVD (Plasma Enhanced Chemical Vapor Deposition) or LPCVD (Low Pressure Chemical Vapor Deposition) TEOS (Tetraethyl Orthosilicate). A photoresist (PR) mask 80 (MASK1, not represented in FIG. 11 but as in FIG. 1, however showing only free spaces where the Super-MOS trenches will appear, not for the deep trenches) is deposited, defining the regions where the Super-MOS trenches will appear. The super-MOS trench etching consists of an etch of the insulating layers 75, 70, 65, e.g. an oxide etch, nitride etch, oxide etch and an etch of the epitaxial layer 60, e.g. a Si etch. The silicon is etched down to the buried layer 55, hence it is depending on the epi layer thickness (typically 3-10 μm). Subsequently, the photoresist mask 80 (PR) is removed. A thin layer of semiconductor material is deposited, e.g. an LPCVD silicon (poly or alpha) layer 95 with a typical thickness of 100±50 nm. A further thick insulating layer such as a thick oxide layer 85 ($\sim$1-5 μm) is deposited e.g. using a chemical vapour deposition technique such as PECVD or LPCVD TEOS such that the super-MOS trenches are completely filled with oxide. The oxide is planarized. A second photoresist mask 90 (PR2) is deposited, defining the regions where deep trench isolation structures have to be formed. Hence, referring to FIG. 11, the left hand side trench will become a deep isolation structure, whereas the right hand side trench will become a super-MOS transistor. Subsequently the thick oxide layer 85, the thin silicon layer 95, the oxide layer 75, nitride layer 70 and oxide layer 65 are etched, after which the exposed Si layer 60 is etched down to the buried layer 55. This is shown in FIG. 11. Thereafter, the second photoresist mask 90 is removed.

(b) A highly doped sinker of the second conductivity type, e.g. a highly doped ($\sim10^{19}$-$10^{20}$ atoms/cm$^3$) n-sinker 100 is introduced by using e.g. diffusion. A thermal budget ($\sim$900-1100° C.) is applied in order to activate the dopants. The diffusion of the dopants must be such that the bottom of the n-sinker profile is still within the BLN profile 55. See FIG. 12.

(c) A second Si trench etching is performed to deepen the trench. The regions with bare silicon (left hand side trench) will be subjected to the etching agent, whereas the regions covered with oxide (right hand side trench) are protected from the etching agent. During the Si etch, also the oxide layer 85 will be partially etched. The combined thickness of oxide layer 85, semiconductor layer 95 and oxide layer 75 must be sufficiently thick in order to have some remaining oxide left after the Si trench etching to protect the nitride1 layer 70. The depth of the second trench etching is determined by the required blocking voltage capability as well as by the doping concentration of the substrate 50 (higher doping concentrations require less deep trenches). The depth of the second trench is typically between 5 and 30 μm. In order to kill the parasitic nMOS of the isolation structure, a p-stop implant 110 is applied. The doping concentration at the bottom of the trench is typically $10^{18}$-$10^{19}$ atoms/cm$^3$. The implant element is typically Boron, but can be any dopant of the first conductivity type, e.g. p-type dopant. In case the substrate 50 is sufficiently doped, the p-stop implant 110 can be omitted. See FIG. 13.

(d) A thin layer of semiconductor material, e.g. a LPCVD silicon (poly or alpha) layer with a typical thickness of 100±50 nm is deposited, followed by a blanked silicon etch. This step will form a silicon spacer (not represented in the drawings) on the side walls of the trench and the remaining hard mask. This spacer will prevent under etch of the oxide hard mask in the next process step. A wet oxide etch is applied in order to remove the thick oxide layer 85. The etch stops on the thin nitride layer 70, and will also remove parts of the thin semiconductor layer 95 and the oxide layer 75. The super-MOS trench must be clean of oxide 85. Subsequently, an insulating liner such as a liner oxide is thermally grown on the trench bottom and sidewalls using wet oxidation, of both the deep trench isolation as well as the super-MOS trenches. The liner oxide thickness must be such that the oxide can withstand the required blocking capability of the transistors/technology. Typically, the oxide thickness is between 300 and 700 nm. The thermal budget associated with the liner oxide growth (typically at 1000° C.) also serves to reduce the stress in the Si lattice due to the trench etching and trench oxidation. The thin oxide and nitride on the top of the Si will create a birds beak at the top of the trench (see FIG. 14).

From here on, the processing is similar to embodiment 1 (i).

The trenches of the Super-MOS are contacted and can be put to the source potential. However, they can also be biased separately, and hence can be put to any potential between Vdd and ground. The poly of the deep trench isolation structure can be contacted and put to any potential, or can be left floating.

Using the embodiments of the invention, the electrical isolation between the last cell of the active device and the drain contact (n-sinker) can be achieved by the oxide of the trench. As there is no more depletion in the Si (because there is no junction termination), the isolation distance between the deep trench isolation and the first cell can be reduced down to e.g. 3 µm. In principle the distance can be reduced further, but then the n-sinker resistance can become too high. Without the double trench approach, the isolation distance is determined by the required blocking capability, and is around 15 µm (10 µm depletion layer width+approximately 5 µm for the n-sinker out diffusion) for 100V, and even larger for higher voltages. The concept can be used for stripe geometries, but also for e.g. square, triangular, hexagonal, circular, . . . geometries.

Compared to the Kodama paper, in which the drain contact is at the bottom (e.g. the drain contact is on a second side of the silicon wafer while the gate and source contact are on a distinct first side of the wafer parallel to the first), the trench is now used for isolation between the drain at the top of the device and an active region of the device. As has been described above, a semiconductor device has a substrate (50), a buried layer (55), an active area extending from a surface contact to the buried layer, an insulator (130) in a first trench extending towards the buried layer, to isolate the active area, and a second insulator (130) in a second deep trench and extending through the buried layer to isolate the buried layer and the active area from other parts of the substrate. This double trench can help reduce the area needed for the electrical isolation between the active device and the other devices. Such reduction in area can enable greater integration or more cells in a multi cell super-MOS device, and so improve performance parameters such as Ron. The double trench can be manufactured using a first mask to etch both trenches at the same time, and subsequently using a second mask to etch the second deep trench deeper. Other variations can be envisaged within the scope of the claims.

The invention claimed is:

1. A method of manufacturing a semiconductor device comprising the steps of forming a buried layer on a substrate, forming an active area extending from a surface contact to the buried layer, forming an insulator in a first trench extending towards the buried layer, to isolate the active area, forming a conductive region extending from a second surface contact to the buried layer between the first trench and the second deep trench, by diffusion from a second trench, and forming a second insulator in the second trench and extending through the buried layer to isolate the buried layer and the active area from other parts of the substrate.

2. The method of claim 1, comprising the steps of using a first mask to etch both trenches at the same time, and subsequently using a second mask to etch the second deep trench deeper.

3. The method of claim 1, comprising the steps of using a first mask to etch both trenches at the same time, and subsequently etching the second trench deeper using an oxide to prevent the first trench from being etched deeper.

4. The method of claim 3, furthermore comprising the step of lining the trenches with a thin layer of semiconductor material and filling at least the first trench with a thick insulating material before the second trench is made deeper.

5. The method of claim 4, furthermore comprising the step of removing the thick insulating layer from the deeper trench, using the semiconductor material as an etch stop.

6. The method of claim 4, furthermore comprising the step of forming a conductive region between the trenches and extending to the buried layer, before the second trench is made deeper.

7. The method of claim 4, furthermore comprising the step, subsequent to the deepening of the second deep trench, of forming a protective spacer on the sidewalls of the second deep trench before removing the thick insulating layer from the first trench.

8. The method of claim 7, furthermore comprising the step of forming an insulator in both trenches after the thick insulating layer has been removed.

9. The method of claim 8, furthermore comprising the step of subsequently providing a conductive layer inside the insulating layer in the trenches.

* * * * *